United States Patent [19]
Krumweide et al.

[11] Patent Number: 5,471,367
[45] Date of Patent: Nov. 28, 1995

[54] COMPOSITE STRUCTURE FOR HEAT TRANSFER AND RADIATION

[75] Inventors: Gary C. Krumweide; Duane E. Krumweide, both of Escondido; Randy Clark, San Diego, all of Calif.

[73] Assignee: Composite Optics, Inc., San Diego, Calif.

[21] Appl. No.: 212,948

[22] Filed: Mar. 15, 1994

[51] Int. Cl.⁶ ............................................. H05K 7/20
[52] U.S. Cl. .................. 361/719; 165/80.3; 165/185; 361/690
[58] Field of Search .................. 165/80.3, 185; 361/690, 697–698, 702–713, 719–720, 725, 796

[56] References Cited

U.S. PATENT DOCUMENTS

| | | | |
|---|---|---|---|
| 3,865,183 | 2/1975 | Roush | 165/80 |
| 4,019,098 | 4/1977 | McCready et al. | 361/385 |
| 4,120,021 | 10/1978 | Roush | 361/388 |
| 4,399,484 | 8/1983 | Mayer | 361/382 |
| 4,449,164 | 5/1984 | Carlson et al. | 361/384 |
| 4,514,746 | 4/1985 | Lundquist | 361/385 |
| 4,573,103 | 2/1986 | Nilsson | 361/386 |
| 4,674,704 | 6/1987 | Altoz et al. | 244/1 R |
| 4,771,365 | 9/1988 | Cichocki et al. | 361/387 |
| 4,785,379 | 11/1988 | Goodrich | 361/690 |
| 4,884,168 | 11/1989 | August et al. | 361/382 |
| 4,953,058 | 8/1990 | Harris | 165/80.3 |
| 5,019,939 | 5/1991 | Reimer | 361/796 |
| 5,057,968 | 10/1991 | Morrison | 361/385 |
| 5,237,484 | 8/1993 | Ferchau et al. | 361/689 |
| 5,316,080 | 5/1994 | Banks et al. | 361/713 |

*Primary Examiner*—Gregory D. Thompson
*Attorney, Agent, or Firm*—Fulwider Patton Lee & Utecht

[57] ABSTRACT

A guide rail assembly for clamping circuit boards in place comprising a guide rail directly attached to a heat radiating fin formed from a graphite fiber reinforced plastic. The fins have tenons that fit within the guide rail to provide additional resistance to clamping forces. The guide rail assembly can be assembled using a variety of bonding methods, including adhesives.

24 Claims, 5 Drawing Sheets

COMPOSITE STRUCTURE FOR HEAT TRANSFER AND RADIATION

BACKGROUND OF THE INVENTION

1. Field of the Invention

This invention generally relates to cooling systems for electronic circuitry and, in particular, to cooling systems for electronic circuit board modules, especially those used in aerospace applications.

2. Description of the Related Art

When designing electrical equipment for use in aerospace applications, designers have often been forced to trade the desirable characteristics of low weight and compact size for larger and heavier configurations to achieve sufficient cooling of the circuitry to insure reliability and extended service life. In today's complex high speed electronic instruments, the heat produced is substantial and various techniques have been proposed for cooling the electronic modules. Many of the proposed techniques involve use of cold plates in physical contact with the electronic circuit boards, or elaborate forced air or fluid cooling designs to transfer heat away from the electronic circuits. Each of these arrangements adds undesirable weight and complexity to the instrument.

In the typical aerospace application, the electronic modules must also be easily accessible for replacement, testing, and repair. In many applications, ease of service of the componentry is so critical as to preclude the use of systems using elaborate cooling methods.

Electronic components are typically arranged on circuit boards that are arranged to form an electronic module. The individual circuit boards are clamped to guide rails in the module housing, and the guide rails may be designed to conduct heat away from the circuit board to a mounting plate. Forced air or circulating fluid is then used to cool the plate. An example of such an arrangement is found in U.S. Pat. No. 5,057,968 issued to Morrison. This method is sometimes inadequate, especially where many circuit boards are mounted within an instrument, because the surface area of the mounting plate may be insufficient to ensure adequate heat transfer from the guide rails.

Until recently, the guide rails and module housing needed to be formed of heat conducting metals, such as aluminum, aluminum/beryllium alloy, (for example "ALBEMET" available from Brushwellman, Cleveland, Ohio) or other suitable materials. The disadvantage of these materials is that while they have high coefficients of thermal-conductivity, they add substantial weight to the module and thus the overall system.

From the above, it can be seen that a need exists for a low weight, highly thermally-conductive circuit board guide rail system that can securely hold an electronic circuit board and still conduct enough heat away from the board to prevent thermal damage. The present invention fulfills this need.

SUMMARY OF THE INVENTION

The present invention is embodied in a system wherein a heat radiating fin, cut from a flat sheet of a graphite fiber reinforced plastic is attached to a guide rail. In this embodiment the fin has one or more tenons that are inserted into mortises formed in the guide rail. This mounting method provides for self fixturing and adhesive bonding of the fin and guide rail. The invention thus provides excellent thermal performance in a lighter, less costly assembly than prior art guide rail and circuit board cooling systems utilizing metal panels for fin construction. Moreover, the use of adhesives in conjunction with the self fixturing capability of the present invention avoids the potential for warpage inherent in the brazing or soldering methods of previous systems, reduces labor required for assembly, and results in reduced manufacturing cost.

The guide rail assembly of the present invention comprises a guide rail attached to a heat radiating fin mounted on a supporting panel. The guide rail may be formed from an extruded metal or metal composite such as aluminum or aluminum/beryllium alloy. The guide rail may have a U-shaped interior channel for attaching the fins, or may be box shaped with an open interior or solid with slots for the fin attachments. Depending on the mounting method used, the guide rails may have additional slots to facilitate self fixturing of the fins during assembly.

The fins can be formed in a variety of shapes to facilitate heat radiation, and may be made from either a heat conductive metal, such as aluminum, or from a graphite fiber reinforced plastic (GFRP). In a preferred embodiment, the fin is inexpensively cut from a sheet of GFRP using a water jet cutter, numerically controlled (N.C.) punch or laser. Preferably, the fins are cut from sheets of GFRP cured so that the graphite fibers are highly oriented (for example, +/−20°). Highly oriented GFRP is up to three times as thermally conductive as aluminum, yet is one third less dense. Another advantage of using GFRP for the heat radiating fin is that bonding to either the guide rail or back panel can be accomplished using adhesives. The use of adhesive substantially enhances the range of guide rail assembly designs available while allowing low cost, less complicated manufacture.

The supporting panel may be either metal or GFRP, and is slotted to allow the fin tenons to extend through for direct thermal contact with the guide rails. In a preferred embodiment, the back panel can be water jet cut or N.C. punched from a sheet of GFRP, thus allowing the fin and guide rails to be attached with adhesives.

While the present embodiment is illustrated in a system intended to be forced air cooled, it will be apparent that the system can easily be adapted for liquid cooling by one skilled in the art. These and other advantages of the invention will become more apparent from the following detailed description when taken in conjunction with the accompanying exemplary drawings.

DETAILED DESCRIPTION OF THE PREFERRED EMBODIMENTS

Figures 1, 2A:
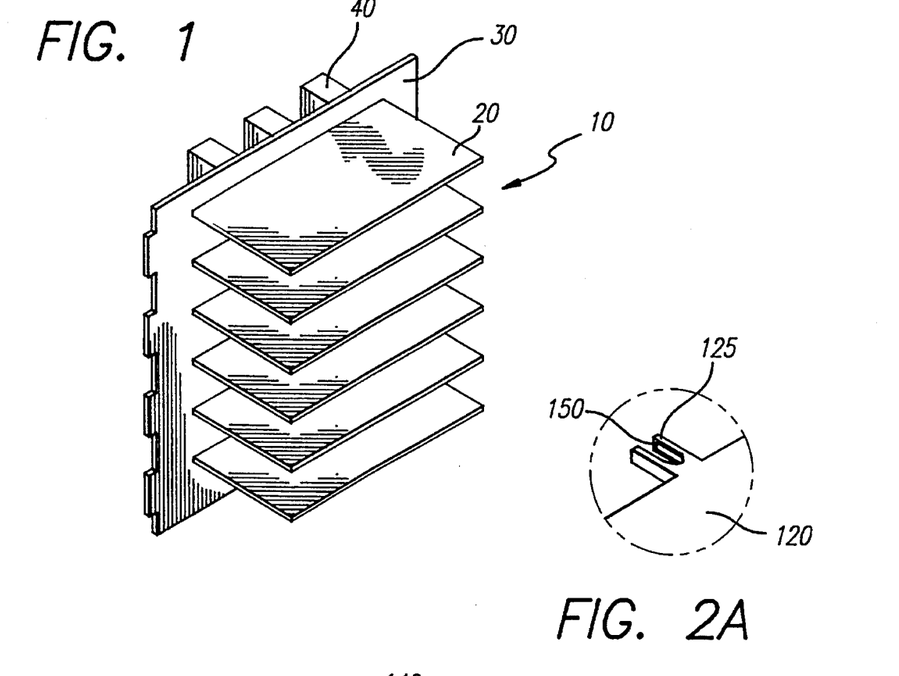
FIG. 1 is a perspective view of the guide rail assembly showing the fins mounted on the front panel, oriented so they are perpendicular to the guide rails.
FIG. 2A is an enlarged perspective view of the fin of FIG. 2 shown partially in cutaway depicting a layer of copper cladding or electroless nickel plating on the surface of the fin.

FIG. 1 is a perspective view illustrating a guide rail assembly generally designated by numeral 10. The guide rail assembly 10 includes a plurality of fins 20 mounted on a panel 30 and in contact with the guide rails 40. Not shown are electronic circuit boards clamped to the guide rails 40. The spacing of the fins 20 allows for either pure convective or forced air convective cooling.

Figure 2:
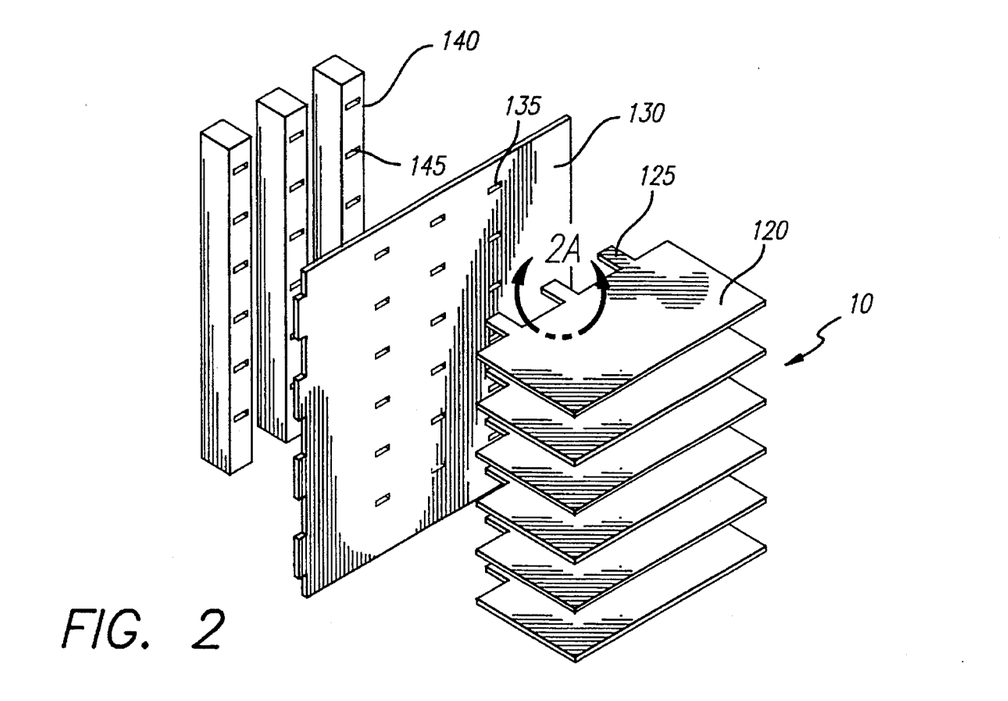
FIG. 2 shows an exploded view of the guide rail assembly of FIG. 1.

FIG. 2 is an exploded perspective view depicting the guide rail assembly of FIG. 1. In this view, a plurality of fins 120 are shown having tenons 125 extending from one edge. The tenons 125 extend through slots 135 in the panel 130. The guide rails 140 have slots 145 that fit onto the tenons 125 of the fins 120. The fins 120 and panel 130 may be fabricated from a thermally conductive metal such as aluminum, aluminum/beryllium alloy, or metal matrix. The guide rails 140 may be either machined or extruded aluminum, copper, aluminum/beryllium alloy, machined silicon carbide or metal matrix composite.

The fins 120 and panel 130 may also be formed from a variety of graphite fiber reinforced plastics (GFRP) that are either punched, laser cut or water jet cut into detailed parts like the fins and panels. Typical GFRP materials are manufactured by curing individual graphite fibers or woven cloth within a graphite/cyanate ester or graphite/epoxy resin matrix. The resulting material is structurally rigid and more easily machined than a metal sheet. The use of highly oriented graphite fibers yields a material with several times the thermal conductivity, yet significantly less weight, than a metal part of similar dimensions.

The guide rail 140 can be joined to tenon 125 using either adhesives, solder or brazing. Typical adhesives that can be used are conductive adhesives such as Eccobond 285 and structural adhesives such as Hysol 9394 available from E. V. Roberts and Assoc., Inc., Culver City, Calif. Typical solders are indium, silver, tin/lead or a suitable alloy. When the fin 120 and guide rail 140 are made from compatible metals, typical brazing methods may be used. In the case where the fin 120 is formed from a GFRP, soldering of the tenon 125 to the metallic guide rail 140 can be enhanced by a copper cladding co-cured to the GFRP sheet before it is cut into the fin 120 or electroless nickel plating the fins (120). Alternatively, a fin 120 may also be bonded to the panel 130 using adhesives to give additional stability to the assembly.

This combination of a highly oriented GFRP fin 120 directly attached to the guide rail 140 is advantageous since it significantly improves heat transfer and radiation away from the attached circuit board without using additional fluid or forced air cooling. Use of these materials also allows use of sheet stock of minimum gage to reduce weight. The guide rails may also be formed with minimum gauge walls to save weight, and still may be able to withstand the substantial clamping forces imparted during circuit board attachment because the fin tenons and adhesive bonding promote structural reinforcement.

In an embodiment where the panel 130 and fins 120 are both formed of GFRP, the slots 135 on panel 130 in each row oriented perpendicularly to the guide rails 140 may be extended to form a single slot extending for the width of fin 120. This allows the fins 120 to be bonded to the guide rails 140 for ease of assembly, and then slipped through the slots in panel 130 and attached to panel 130 using adhesive.

It should be understood that while fins 120 are shown as panels, they may also be any shape that can be formed from a GFRP material. Such shapes include, but are not limited to, structures with fins arranged in a radial structure, or cylindrical fins capable of having a fluid pumped through them. Obviously, any shape is allowed that will fit within the design constraints of the electronic module and that is capable of withstanding, and suitable for, the cooling method used.

Figure 3:
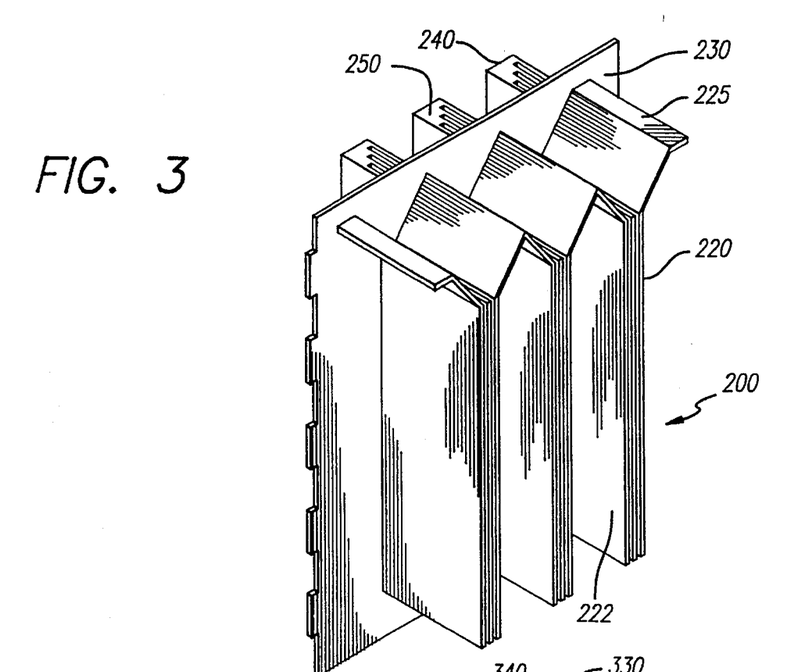
FIG. 3 shows a perspective view of the guide rail, assembly showing sets of fins oriented parallel to the guide rails, with an air flow deflector in place.

FIG. 3 illustrates an alternative embodiment of the invention showing a guide rail and fin assembly 200 wherein individual fins 220 are arranged into fin assemblies 222 comprised of three individual fins 220. It should be understood that while fin assembly 222 is shown with 3 individual fins 220, any number of fins can be used to make up fin assembly 222 subject to their ability to be fastened onto a single guide rail 240. In this view, guide rails 240 are shown having longitudinally directed slots 250. Also shown is a flow director 225 attached to an individual fin 220. It should be noted that the shape of the flow director 225 is shown for example only and any configuration suitable for enhancing forced air or fluid flow over the surfaces of fins 220 is acceptable. It is also obvious that the flow directors 225 are optional in that not every application will require the additional thermal transfer efficiency imparted by the flow directors to the assembly.

Figure 4:
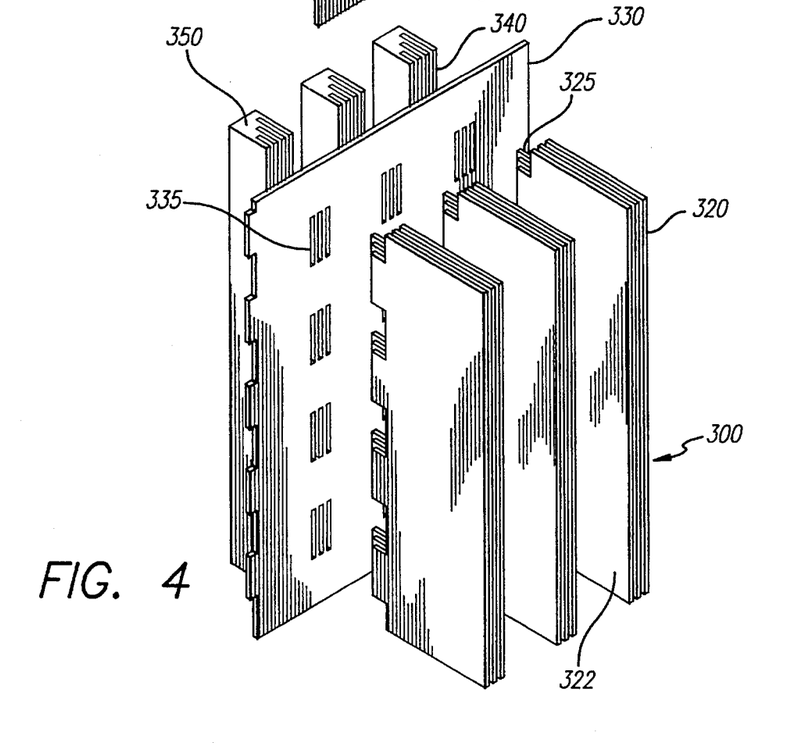
FIG. 4 is an exploded view of the guide rail assembly in FIG. 3 shown without the air flow deflector.

FIG. 4 shows an exploded view of the guide rail assembly illustrated in FIG. 3, except that for clarity, the flow directors 225 are not shown. The guide rail assembly 300 is shown having fin assemblies 322 comprised of three individual fins 320. As noted above, the number of fins shown is used for illustration purposes only, and any number of fins may be used to comprise fin assembly 322 limited only by the physical dimensions of the guide rails 340. The fins 320 have tenons 325 that are fitted to, and extend through, the slots 335 shown on panel 330. Guide rails 340 having slots 350 extending along their length are attached to fins 320 by mounting on the tenons 325 extending through panel 330.

Construction of the guide rail assembly of the present invention will now be generally described. In one embodiment, the fins 120 are cut from sheets of a GFRP, selected based upon the structural and thermal conduction requirements of the particular application. For example, the GFRP may be selected from the materials listed in Table I. Alternatively, the sheet material can also be selected from the metallic sheet materials listed in Table II.

The fins are shaped by either punching them from the sheet using an appropriate cutting die and punch press, conventional N.C. machining or preferably, cutting them from the sheet using a water jet. The advantage of using water jet cutting is that complex shapes can be repeatably produced at low cost without the use of expensive sheet metal equipment requiring large capital expenditures for cutting dies that wear out frequently and need frequent repair or replacement.

In one embodiment the fins 120 take the form of rectangular panels and have at least one, or preferably, several, tenons 125 formed on one edge.

In the embodiment depicted in FIG. 2, where the fins 120 are oriented so that they are perpendicular to the longitudinal axis of the guide rails, each tenon 125 of a fin 120 attaches to one guide rail. Thus, it is apparent that in one embodiment a fin 120 can be attached to more than one guide rail.

FIG. 2 depicts the guide rails 140 as solid bars having slots 145, oriented perpendicular to the longitudinal axis of the guide rail 140, cut into one face of the guide rail. The slots 145 are cut sufficiently wide and deep to accept the tenon 125 of the fin 120. It is apparent that a designer will coordinate the depth of slot 145 and the extension of tenon 125 so that when assembled, the fin 120 and guide rail 140 are mounted so as to be in contact with opposite sides of panel 130.

Panel 130 may be formed from sheet metal, for example one selected from Table II or more preferably, from a GFRP material, for example, one selected from Table I. The panel 130 has a plurality of slots 135 extending from a first side of the panel to a second side. The panel and slots may be formed in any conventional manner, but will preferably be cut out using a water jet for the reason stated previously. In the embodiment of the invention shown in FIG. 2, the slots 135 are arranged in columns coinciding with the desired placement of guide rails 140. The slots 135 are also arranged to coincide with location of the slots 145 in the guide rails 140.

In a presently preferred embodiment, the invention is assembled by inserting the tenons 125 of the fin 120 through the slots 135 of the panel 130. The guide rails 140 are then mounted on the tenons 125 extending through the panel 130 so that a tenon 125 extends into a slot 145 in the guide rail 140.

The guide rail 140, panel 130 and fin 120 may be permanently bonded together using a variety of methods. In an embodiment where the guide rail 140, panel 130 and fin 120 are each formed from a metal, solder or brazing can be used. Alternatively, a suitable adhesive could be used.

In another embodiment where fins are formed from a GFRP, while the guide rails 140 and panel 130 are metal, the fin can be cut from a sheet of GFRP that has been cocured with a thin sheet of copper cladding material or is electroless nickel plated 150 (FIG. 2A) to enhance the bonding of the fin 120 to the panel 130 and to guide rail 140 using solder.

A prime advantage to constructing guide rail assemblies using the present invention is apparent from the embodiment depicted in FIGS. 3 and 4. Using the present invention, the designer has great freedom in designing guide rails to meet a variety of cooling requirements. In FIG. 4, several fins 320 are grouped together and attached to a single rail. This arrangement may prove useful in producing optimal cooling because it significantly increases the surface area of cooling fins 320 available to cool each guide rail. This arrangement might be preferable where the circuit boards attached to the individual guide rails 340 have components that either differ in heat output, or where a circuit board has componentry that needs to be thermally isolated from circuit boards producing heat.

In this embodiment, the guide rails 340 are shown having three longitudinally oriented slots 350 extending the length of guide rail 340. Fin assemblies 322 comprise, for example, three individual fins 320 mounted on panel 330. The fins 320 have tenons 325 that extend through the slots 335 in the panel 330. The guide rails are then attached to the tenons by mounting the guide rails 340 so that the tenons 325 of fins 325 are positioned within one slot 350.

FIG. 3 depicts the assembled guide rail assembly of FIG. 4, and also shows flow deflectors 225 in place. These deflectors 225 are preferably cut from a GFRP and attached to fin assembly 222 and panel 230 with a suitable adhesive. This further illustrates the advantages of design freedom, high performance, and low manufacturing cost inherent in the present invention.

Figure 5:
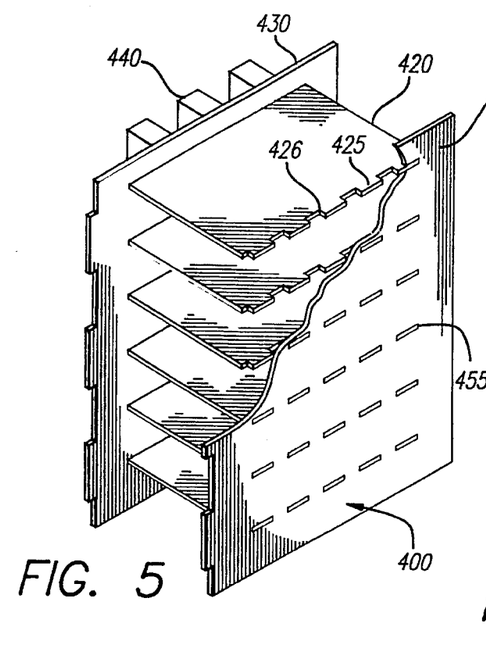
FIG. 5 is a partially cutaway perspective view depicting a guide rail assembly with fins oriented perpendicularly to the guide rails and with a back panel in place.

FIG. 5 shows another embodiment of the present invention wherein guide rail assembly 400 is constructed as the assembly in FIG. 1 with fins 420 oriented perpendicular to the longitudinal extension of the guide rails 440 and mounted through panel 430. The fins 420 also have tenons 425 on the edge opposite to that intended for mounting on the guide rails. A back panel 450 having slots 455 machined into it is fitted to the guide rail assembly 400 in such a manner that the fin tenons 425 fit within the slots 455. It will be obvious to one skilled in the art that use of GFRP to manufacture the fins 420 and back panel 450 allows them to be joined using adhesives, thus simplifying fabrication of the guide rail assembly and minimizing weight while maximizing thermal conductivity. The addition of back panel 450 allows for direction of a flow of either forced air or fluid across the surfaces of the fins. The back panel may also be used to impart additional structural rigidity to the guide rail assembly 400.

Figure 8A:
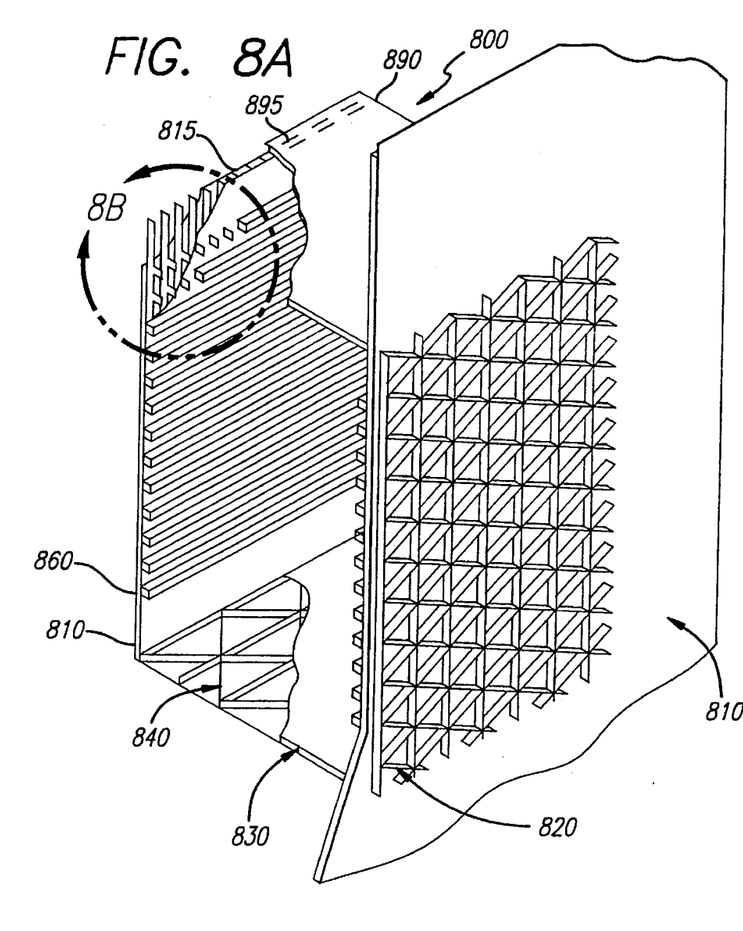
FIG. 8A is a partially cut away perspective view of an electronic chassis illustrating the use of one embodiment of the present invention.
Figure 8B:
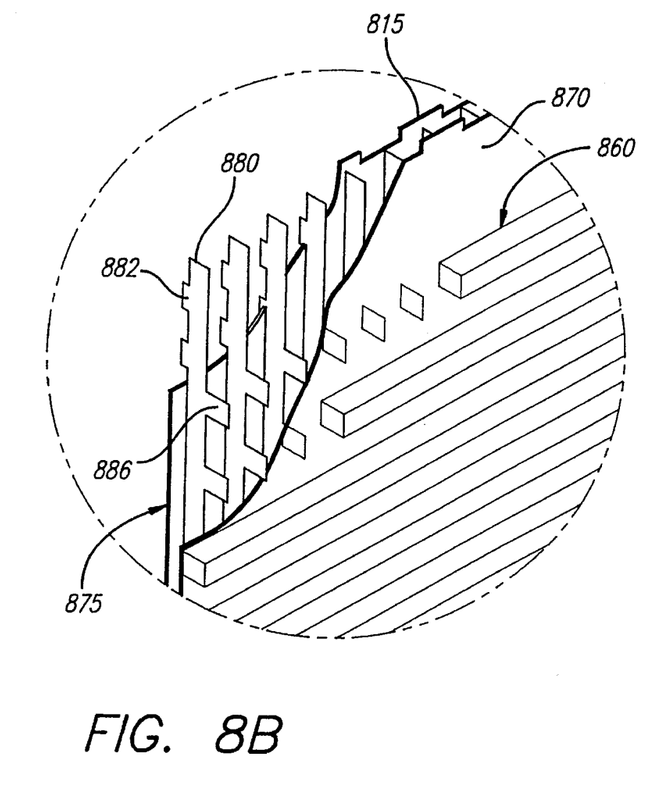
FIG. 8B is an enlarged view showing the construction of one of the sides of the electronic chassis of FIG. 8A.

A typical electronic chassis 800 incorporating various features and embodiments of the present invention is illustrated in FIGS. 8A–8B. The electronic chassis 800 is a generally box shaped structure, although other structural shapes are possible, having guide rails 860 mounted on the inside panels 870 of the side panel assemblies 810. In these figures, the side panel assemblies are shown having the panel-fin-panel construction previously described and illustrated in FIG. 5. FIG. 8B is an enlarged view of a side panel assembly 810. Inside panel 870 has mortises (not shown) through which the inside tenons 886 of the fins 880 extend. The guide rails 860 are then mounted upon the portion of the inside tenons 886 that extend beyond the inside surface of the inside panel 870. Outside panel 875 also has mortises configured to receive the outside tenons 882 of the fins 880. The mortises on outside panel 875 are sized so that outside tenons 882 form a friction fit when they extend through the mortises, thus providing self-fixturing. Once mounted on the outside tenons 882 of fin 880, the outside panel 875 may be permanently affixed to the fins 880 with adhesive as described above. Outside tenons 882 may be sized so that they extend above the surface of outside panel 875, thus providing convenient attachment points for additional panels, cooling structures, or other equipment or instrumentation.

Since the individual pieces of the electronic chassis 800 can be fashioned from flat panels of GFRP materials, it is possible to include other features to enhance the self-fixturing of the entire structure. For example, top panel 890 is shown having mortises 895 configured to receive tenons 815 formed on the ends of inside panel 870 and outside panel 875. This arrangement can also be incorporated for the interconnection of the side panel assemblies 810 with the bottom panel 830. Thus the entire structure is capable of self-fixturing, and all portions may be permanently affixed using adhesive. This method of construction offers significant cost and weight reduction over prior construction methods. Additionally, the fins may be configured in an isogrid pattern 840 to further stiffen the bottom panel 830 and top panel 890. It will be apparent that the arrangement of individual parallel oriented fins 880 can be replaced with a pattern of interconnected fins and diagonal stiffeners as illustrated by isogrid 840, substantially increasing the stiffness of the side panel assembly 810 without sacrificing thermal efficiency.

Other structures, such as, for example, the isogrid cooling structure 820 shown in FIG. 8A, may also be fashioned according to the methods of the present invention. The isogrid cooling structure is formed according to the embodiment of the invention illustrated in FIG. 2. However, while the tenons of the fins comprising the isogrid cooling structure 820 may extend completely through the side panel assembly 810 into the guiderails 860, the tenons may also extend only into the side panel assembly 810 without coming into contact with the guiderails 860. The isogrid cooling structure can then be permanently affixed to the side panel assembly 810 with adhesive. This arrangement provides the ability to easily increase the area for heat radiation to enhance cooling of the electronic chassis 800.

Figure 9:
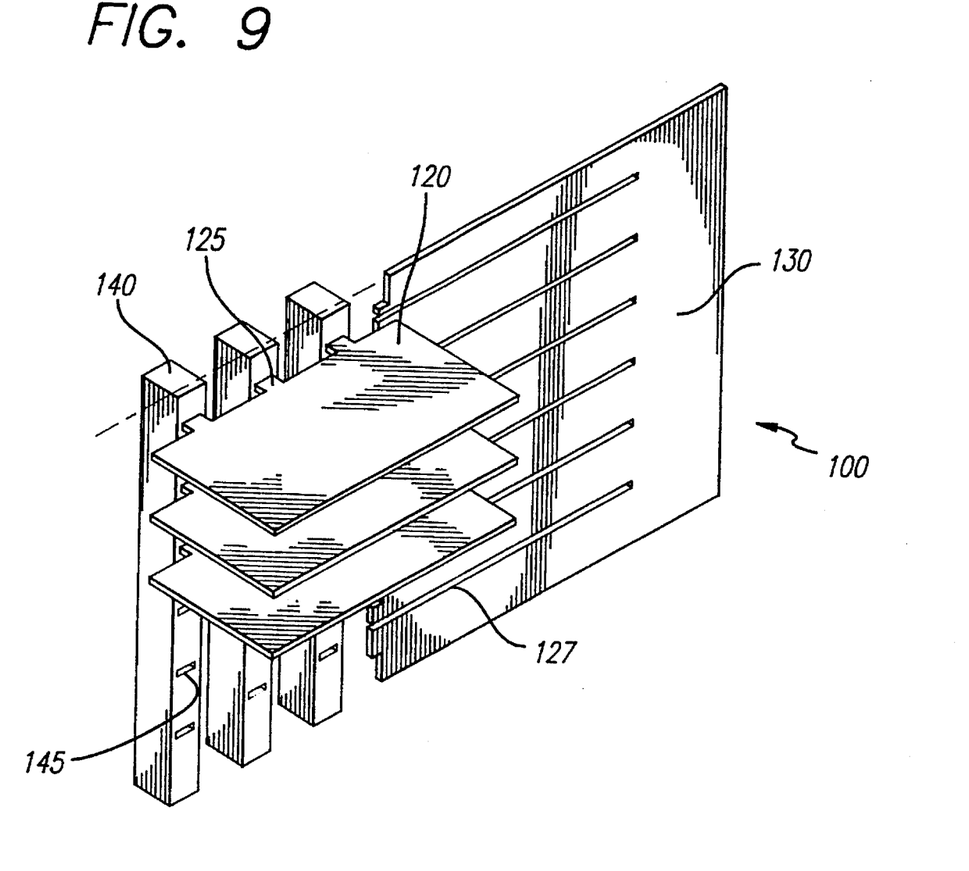
FIG. 9 a perspective view of another embodiment of the present invention showing the fin and guiderail assembly mounted in slots of an electronic module panel.

FIG. 9 shows another embodiment of the present invention illustrating the advantages of the self-fixturing feature. In this embodiment, the fins 120 are mounted on the guiderails 140 by inserting the tenons 125 of the fins 120 into the mortises 145 of the guiderails 140. In the embodiment shown, the panel 100 has one or more slots 127 extending from one edge of the panel 100 to a position short of the opposite edge of the panel and adapted to receive the guiderail and fin assembly. The panel 100 in this embodiment may thus be slideably mounted on the guiderail and fin assembly by sliding the slots 127 over the tenons 125 and fins 120 or, alternatively, sliding the tenons 125 and fins 120 into the slots 127.

Figure 6A:
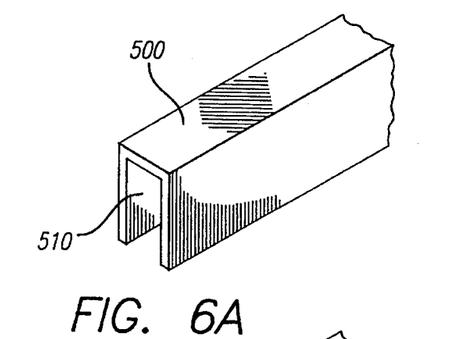
FIG. 6A is a perspective view of a guide rail depicted as having a U-shaped channel.

FIGS. 6A–6D depict a variety of embodiments of the guide rails. FIG. 6A shows a simple extruded guide rail 500 with a U-shaped channel 510. As previously stated, this configuration can be fabricated using aluminum, aluminum/beryllium alloy, copper or other thermally conductive material that is compatible with the bonding techniques to be used.

Figure 6B:
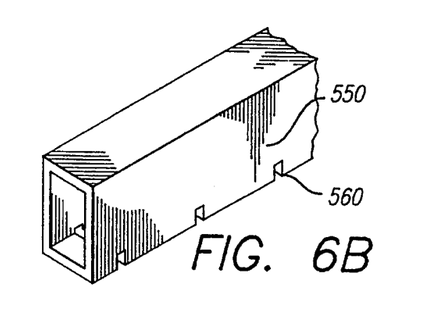
FIG. 6B is a perspective view of an alternative embodiment of the guide rail shown as a hollow box shaped member with slots for mounting the fin tenons.

FIG. 6B shows a guide rail 550 constructed from a square tubular member. The square tube 550 has slots 560 cut into one side and extending for a short distance through the two sides perpendicular to the slotted face. This construction allows self fixturing of the fins to the guide rails for ease of assembly in certain applications. Additional description of this technique will follow.

Figure 6C:
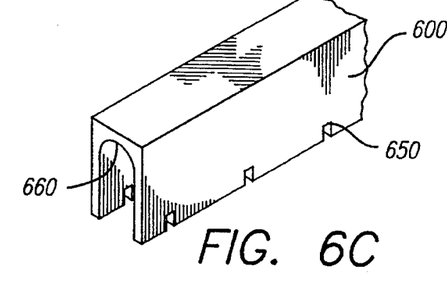
FIG. 6C is a perspective view of an alternative embodiment of the guide rail depicted as a radiused U-shaped member with slots to enable self fixturing.

FIG. 6C depicts a guide rail 600 formed from a simple channel like that of FIG. 6A except that the interior channel shape 660 is radiused rather than square. This radius can be formed to match a radius formed on the edge of a fin tenon. Guide rail 600 also shows slots 650 similar to those described in FIG. 6B for use in self fixturing the fins.

Figure 6D:
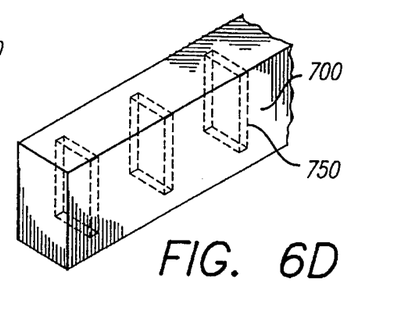
FIG. 6D is a perspective view of an alternative embodiment of a self fixturing feature for the guide rail depicted as a solid bar having slots for accepting the fin tenons.

FIG. 6D shows another embodiment of a guide rail manufactured from a solid bar 700 wherein slots 750 are cut into one face of the guide rail as described previously. It should be noted that all of the configurations illustrated are exemplary only and other configurations will be obvious to one skilled in the art without departing from the inventive concept of the present invention.

Figure 7:
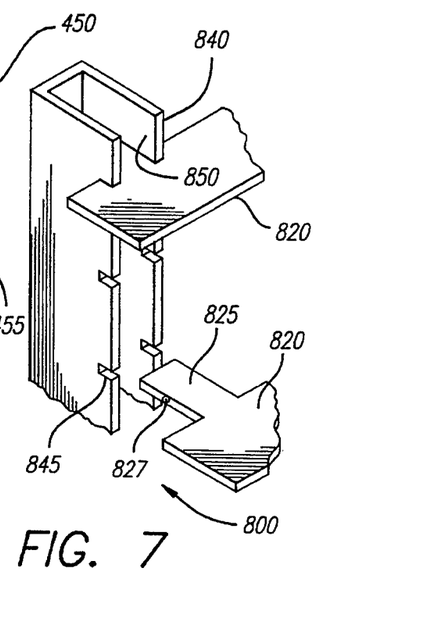
FIG. 7 is a perspective view depicting one embodiment of self fixturing feature for the guide rail assemblies.

FIG. 7 depicts an arrangement where the guide rail 840 is formed from a U-shaped metal channel. A guide rail having this configuration is substantially lighter than a guide rail of comparable dimensions formed from a solid bar or a box-shaped extruded metal piece. This configuration, however, is less resistant to the clamping forces imposed on it during circuit board attachment. The present invention overcomes this disadvantage because the tenon 825 of the fin 820, when inserted into position within the channel 850, acts as a strut providing support to prevent collapse of the channel during clamping.

Mortises 845 can be cut into the channel walls. Tenons 825 can be designed so that when inserted into the channel 850, the body of the fin also extends through the walls of the channel. This arrangement is advantageous, as will be apparent to a person skilled in the art, in that it provides self-fixturing for the fin 820 and guide rail 840 to simplify attachment.

Using this arrangement, the fins 820 can be mounted on guide rail 840 without first mounting the fins 820 on a panel, as depicted in FIGS. 1 and 2. The fins 820 can be attached to the guide rail 840 using a bonding means 827 such as adhesive, solder, or brazing as appropriate. Additionally, a structural adhesive can be used to fill channel 850, providing additional resistance to clamping forces, yet still weighing less than a comparable solid guide rail.

This arrangement is then mounted on a panel, such as that shown in FIG. 2. However, because the fins are already mounted on the guide rails, the slots 135 shown in panel 130 are extended, joining all the slots in a row of slots, so that each slot is wide enough to accept the entire width of fin 820. Thus, for ease of assembly, guide rail assemblies 800 with fins 820 in place are arranged as desired. The panel is then lowered onto the guide rail and fin assemblies, the fins passing through the slots in the panel. Where the fins and panel are cut from GFRP, a suitable adhesive is then applied to permanently bond the fins to the panel. This exemplary method eliminates the need for expensive fixturing to assemble the guide rail assemblies.

Thus, the present invention, as depicted in the above embodiments, provides a guide rail assembly that has superior thermal conductivity, lower weight, ease of manufacturing and lower cost than comparable guide rails formed using present techniques and materials.

While several particular forms of the invention have been illustrated and described, it will also be apparent that various modifications can be made without departing from the spirit and scope of the invention. Accordingly it is not intended that the invention be limited, except as by the appended claims.

TABLE I

| GFRP Materials |
| --- |
| K1100X/954-3* |
| P120S/954-3* |
| P100S/954-3* |
| P 75S/954-3* |
| XN 80/954-3* |
| M 60J/954-3* |

Oother graphite esters on epoxy resin systems

TABLE I-continued

GFRP Materials

*Graphite/Cyanate composite material available from Fiberite, Inc., Tempe, AZ.

TABLE II

Sheet Metal Materials

Aluminum 6061-T6+
Aluminum/beryllium alloy
Copper
Silver
Metal Matrix Composite

+Aluminum alloy available from Jorgensen Steel and Aluminum, Lynwood, California.

We claim:

1. A guide rail assembly for mounting to an electronic module panel, the guide rail assembly comprising:
   a heat dissipating fin having a first edge having at least one tenon on said first edge; and
   a guide rail for holding an electronic circuit board, the guide rail having a first channel along a first longitudinal side for receiving said tenon of said fin, and a second longitudinal side for receiving the edge of an electronic circuit board,
   wherein said guide rail and said fin when attached have a space between them that slidably fits within a slot in said electronic module panel.

2. The guide rail assembly of claim 1, wherein said fin extends in a longitudinal direction, the length of which matches the length of said guide rail.

3. The guide rail assembly fin of claim 2, wherein said fin is formed from metal.

4. The guide rail assembly of claim 2, wherein said fin is fabricated from a graphite fiber reinforced plastic.

5. The guide rail assembly of claim 4, wherein said graphite fiber reinforced plastic is highly oriented.

6. The guide rail assembly of claim 1, wherein said guide rail is fabricated by extrusion of a thermally conductive metal.

7. The guide rail assembly of claim 1, wherein said fin is attached to said guide rail using an adhesive.

8. The guide rail assembly of claim 1, wherein said fin is brazed to said guide rail.

9. The guide rail assembly of claim 4, wherein said graphite fiber reinforced plastic is co-cured with a thin copper sheet for improved soldering to said guide rail.

10. The guide rail assembly of claim 4, wherein said fin fabricated from said graphite fiber reinforced plastic is electroless nickel plated for improved soldering to said guide rail.

11. The guide rail assembly of claim 1, wherein said fin is soldered to said guide rail.

12. A guide rail assembly comprising:
    a supporting means for locating an electronic circuit board in position relative to other electronic circuit boards in an electronic module, said supporting means having at least one slot located adjacent the desired position of the electronic circuit board;
    a guide rail for mounting the electronic circuit board to said supporting means, said guide rail having a back surface having at least one slot therein;
    at least one fin for radiating heat from the circuit board and for holding said guide rail to said supporting means in the desired position, said fin having a first edge for extending through the at least one slot of said supporting means and into the slot on the back surface of said guide rail.

13. The guide rail assembly of claim 12 wherein said fin is formed from a graphite fiber reinforced plastic material.

14. The guide rail assembly of claim 13, wherein said graphite fiber reinforced plastic is co-cured with a thin copper sheet for improved soldering to said guide rail.

15. The guide rail assembly of claim 13, wherein said fin fabricated from said graphite fiber reinforced plastic is electroless nickel plated for improved soldering to said guide rail.

16. The guide rail assembly of claim 12 wherein the first edge of said fin comprises at least one tenon.

17. The guide rail assembly of claim 16 wherein the at least one slot of said supporting means has a length and a width greater than the length and thickness of said tenon of said fin.

18. The guide rail assembly of claim 12 wherein said supporting means is formed from a graphite fiber reinforced plastic material.

19. The guide rail assembly of claim 3, wherein said graphite fiber reinforced plastic is co-cured with a thin copper sheet for improved soldering.

20. The guide rail assembly of claim 3, wherein said graphite fiber reinforced plastic is electroless nickel plated for improved soldering.

21. The guide rail assembly of claim 12 further comprising:
    bonding means for attaching said fin to said guide rail.

22. The guide rail assembly of claim 21 wherein said bonding means is an adhesive.

23. The guide rail assembly of claim 21 wherein said bonding means is solder.

24. The guide rail assembly of claim 21 wherein said bonding means is brazing.

* * * * *

UNITED STATES PATENT AND TRADEMARK OFFICE
CERTIFICATE OF CORRECTION

PATENT NO. : 5,471,367
DATED : November 28, 1995
INVENTOR(S) : Gary C. Krumweide, Duane E. Krumweide, Randy Clark It is certified that error appears in the above-identified patent and that said Letters Patent is hereby corrected as shown below:

Column 1, line 3, insert a new paragraph that reads --The Government has a paid-up license in this invention and the right in limited circumstances to require the patent owner to license others on reasonable terms as provided for the terms of Contract No. F29601-95C-0077 awarded by the Department of the Air Force.--

Signed and Sealed this

Twenty-fifth Day of May, 1999

Attest:

Q. TODD DICKINSON

*Attesting Officer*  *Acting Commissioner of Patents and Trademarks*